United States Patent
Tabe et al.

(10) Patent No.: US 9,530,924 B2
(45) Date of Patent: Dec. 27, 2016

(54) METHOD OF MANUFACTURING SOLAR CELL MODULE

(71) Applicant: Sanyo Electric Co., Ltd., Moriguchi, Osaka (JP)

(72) Inventors: Tomonori Tabe, Moriguchi (JP); Yosuke Ishii, Moriguchi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 91 days.

(21) Appl. No.: 13/869,089

(22) Filed: Apr. 24, 2013

(65) Prior Publication Data

US 2013/0237000 A1    Sep. 12, 2013

Related U.S. Application Data

(63) Continuation of application No. PCT/JP2011/074531, filed on Oct. 25, 2011.

(30) Foreign Application Priority Data

Oct. 26, 2010   (JP) .................................. 2010-239723
Jan. 28, 2011   (JP) .................................. 2011-016735

(51) Int. Cl.
  B32B 17/10  (2006.01)
  H01L 31/0224  (2006.01)
  (Continued)

(52) U.S. Cl.
  CPC ......... H01L 31/18 (2013.01); B32B 17/10018 (2013.01); B32B 17/10788 (2013.01);
  (Continued)

(58) Field of Classification Search
  CPC ................................................... H01L 31/0512
  (Continued)

(56) References Cited

U.S. PATENT DOCUMENTS 6,369,316 B1 *  4/2002  Plessing et al. ............... 136/251
6,479,744 B1 * 11/2002  Tsuzuki et al. ............... 136/256
(Continued)

FOREIGN PATENT DOCUMENTS

JP    2004-167881 A    6/2004
JP    2008-205045 A    9/2008
(Continued)

*Primary Examiner* — Jarrett Stark
*Assistant Examiner* — Charles N Ausar-El

(57) ABSTRACT

An aspect of the invention is a method of manufacturing a solar cell module in which wiring members are electrically connected to front and back electrodes on front and back sides of a solar cell with resin adhesion films. The total area of the front electrode is smaller than that of the back electrode. The method includes: arranging the resin adhesion films on the front and back electrodes; arranging a first cushion sheet and a lower press member below the lower resin adhesion film and arranging a second cushion sheet being thicker than the first cushion sheet and an upper press member above the upper resin adhesion film; pressing the press members against each other thereby bonding the resin adhesion films to the solar cell; and releasing the pressure to the press members and moving the first and second cushion sheets away from the solar cell.

7 Claims, 16 Drawing Sheets

(51) Int. Cl.
*H01L 31/05* (2014.01)
*H01L 31/18* (2006.01)

(52) U.S. Cl.
CPC .. *H01L 31/022433* (2013.01); *H01L 31/0512* (2013.01); *H01L 31/188* (2013.01); *Y02E 10/50* (2013.01)

(58) Field of Classification Search
USPC .......................................................... 438/57
See application file for complete search history.

(56) References Cited

U.S. PATENT DOCUMENTS

| | | | | |
|---|---|---|---|---|
| 6,515,218 | B1* | 2/2003 | Shimizu et al. | 136/256 |
| 6,586,271 | B2* | 7/2003 | Hanoka | 438/66 |
| 7,998,760 | B2* | 8/2011 | Tabe | 438/15 |
| 9,082,917 | B2* | 7/2015 | Saita | H01L 31/022433 |
| 2003/0102466 | A1* | 6/2003 | Kumakura | C09J 7/00 |
| | | | | 252/511 |
| 2008/0061111 | A1* | 3/2008 | Kiriyama | 228/47.1 |
| 2008/0121265 | A1* | 5/2008 | Hishida | H01L 31/022425 |
| | | | | 136/244 |
| 2008/0121266 | A1* | 5/2008 | Tsunomura et al. | 136/244 |
| 2008/0283117 | A1* | 11/2008 | Tsunomura | H01L 31/049 |
| | | | | 136/251 |
| 2009/0044856 | A1* | 2/2009 | Yoshimine et al. | 136/256 |
| 2009/0056784 | A1* | 3/2009 | Reinisch | H01L 31/05 |
| | | | | 136/244 |
| 2009/0288697 | A1* | 11/2009 | Shimizu et al. | 136/244 |
| 2010/0018646 | A1* | 1/2010 | Metzger et al. | 156/285 |
| 2010/0022047 | A1* | 1/2010 | Yamazaki | H01L 31/02167 |
| | | | | 438/67 |
| 2010/0116314 | A1* | 5/2010 | Fukushima et al. | 136/244 |
| 2010/0126551 | A1* | 5/2010 | Okamoto et al. | 136/244 |
| 2010/0181011 | A1* | 7/2010 | Hashimoto et al. | 156/166 |
| 2010/0240166 | A1 | 9/2010 | Ishii et al. | |
| 2012/0012153 | A1* | 1/2012 | Azechi | H01B 1/22 |
| | | | | 136/244 |
| 2012/0125396 | A1* | 5/2012 | Taira | H01L 31/022433 |
| | | | | 136/244 |
| 2012/0214271 | A1* | 8/2012 | Ishii | H01L 31/188 |
| | | | | 438/80 |
| 2014/0150844 | A1* | 6/2014 | Azechi et al. | 136/244 |

FOREIGN PATENT DOCUMENTS

| | | | |
|---|---|---|---|
| JP | 2008-235354 A | | 10/2008 |
| JP | 2010-225777 A | | 10/2010 |
| WO | WO2009/104627 | * | 8/2009 |
| WO | 2010/103998 A1 | | 9/2010 |

* cited by examiner

METHOD OF MANUFACTURING SOLAR CELL MODULE

CROSS REFERENCE TO RELATED APPLICATIONS

This application is a continuation application of International Application No. PCT/JP2011/074531, filed on Oct. 25, 2011, entitled "METHOD OF MANUFACTURING SOLAR CELL MODULE", which claims priority based on Article 8 of Patent Cooperation Treaty from prior Japanese Patent Applications No. 2010-239723, filed on Oct. 26, 2010 and No. 2011-016735, filed on Jan. 28, 2011, the entire contents of which are incorporated herein by reference.

BACKGROUND OF THE INVENTION

1. Field of the Invention

This disclosure relates to a method of manufacturing a solar cell module including a solar cell string in which wiring members are connected to solar cells by using resin adhesion films.

2. Description of Related Art

Solar cells are expected as a new energy source because they can directly convert clean and inexhaustible sunlight into electricity.

In general, the output power per solar cell is about several watts. For this reason, when such a solar cell is used as a power supply for a house, a building or the like, a solar cell module having multiple solar cells connected to one another to increase the output power thereof is used. A solar cell module includes a solar cell string having multiple solar cells electrically connected to one another with wiring members.

As a method of connecting a wiring member to a solar cell, a method using a resin adhesion film is known (see Patent Document 1, for example). As this conventional technique, there is described a technique of preventing cracks of a solar cell which may otherwise be generated if front and back electrodes thereof are displaced from each other.

Patent Document 1: Japanese Patent Application Publication No. 2008-235354

SUMMARY OF THE INVENTION

However, when a solar cell string is manufactured using the above conventional technique, a manufacturing yield is reduced in some cases.

An embodiment of the invention is made in view of the above circumstances, and aims to provide a method of manufacturing a solar cell module with a good yield.

An aspect of the invention relates to a method of manufacturing a solar cell module in which wiring members are electrically connected to electrodes provided on front and back sides of a solar cell by use of resin adhesion films. The electrodes are provided on front and back sides of a substrate of the solar cell respectively. The total area of the electrode on the front surface is smaller than the total area of the electrode on the back surface. The method includes: arranging resin adhesion films on the front and back electrodes, respectively; arranging a first cushion sheet and a lower press member below the lower resin adhesion film in this order and arranging a second cushion sheet and an upper press member above the upper resin adhesion film in this order, the second cushion sheet being thicker than the first cushion sheet; and sticking the resin adhesion films on the front and back electrodes of the solar cell respectively by applying pressure to the lower press member and the upper press member in directions opposed to each other and thereby pressure-bonding the resin adhesion films to the front and back electrodes of the solar cell, and by releasing the pressure to the upper and lower press members to move the members away from each other and moving the first and second cushion sheets away from the resin adhesion films.

According to the aspect of the invention, resin adhesion films can be bonded to front and back electrodes of a solar cell with good adhesion.

DETAILED DESCRIPTION OF EMBODIMENTS

Figure 1:
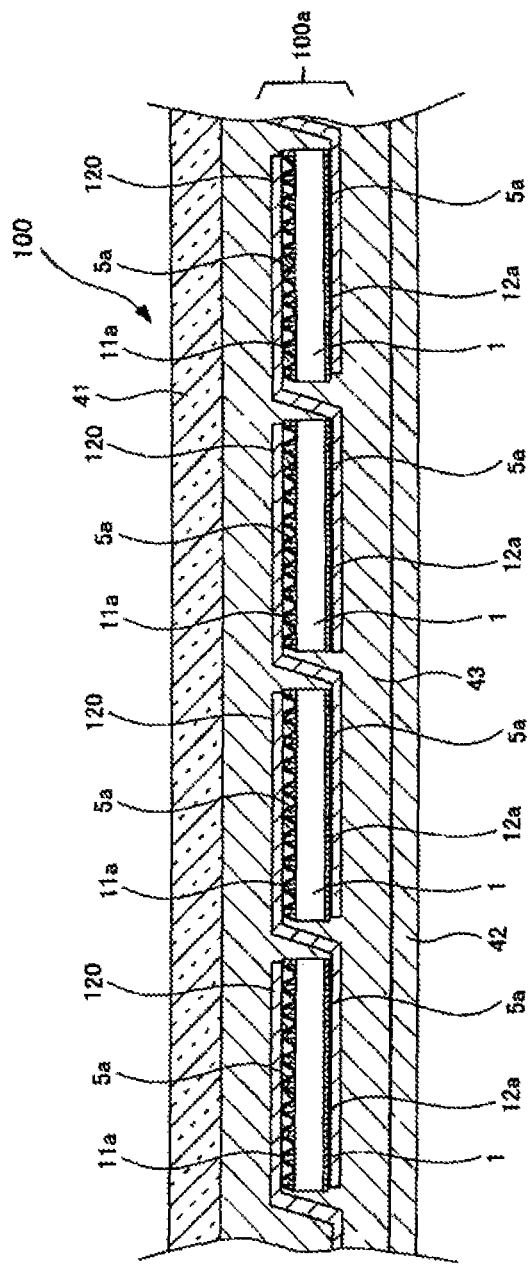
FIG. 1 is a cross-sectional view schematically showing a solar cell module.

Embodiments of the invention are described in detail with reference to the drawings. Note that the same or equivalent parts in the drawings are given the same reference numerals and are not described again for avoiding duplicate description.

Figure 2:
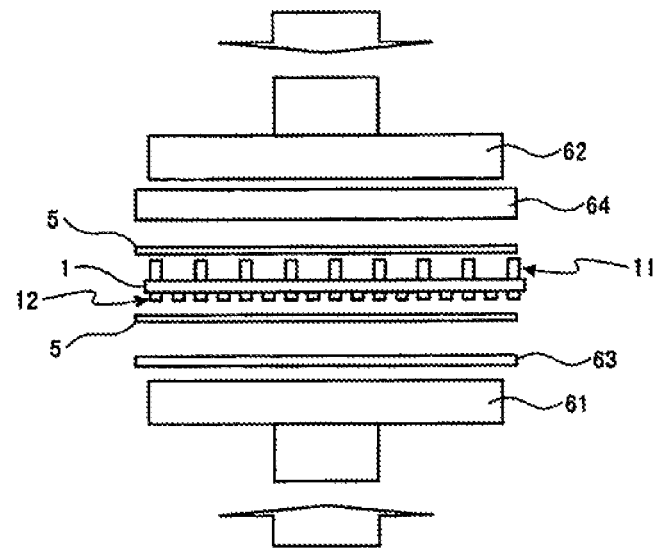
FIG. 2 is a side view showing a step of bonding conductive resin adhesion films according to a first embodiment.
Figure 3:
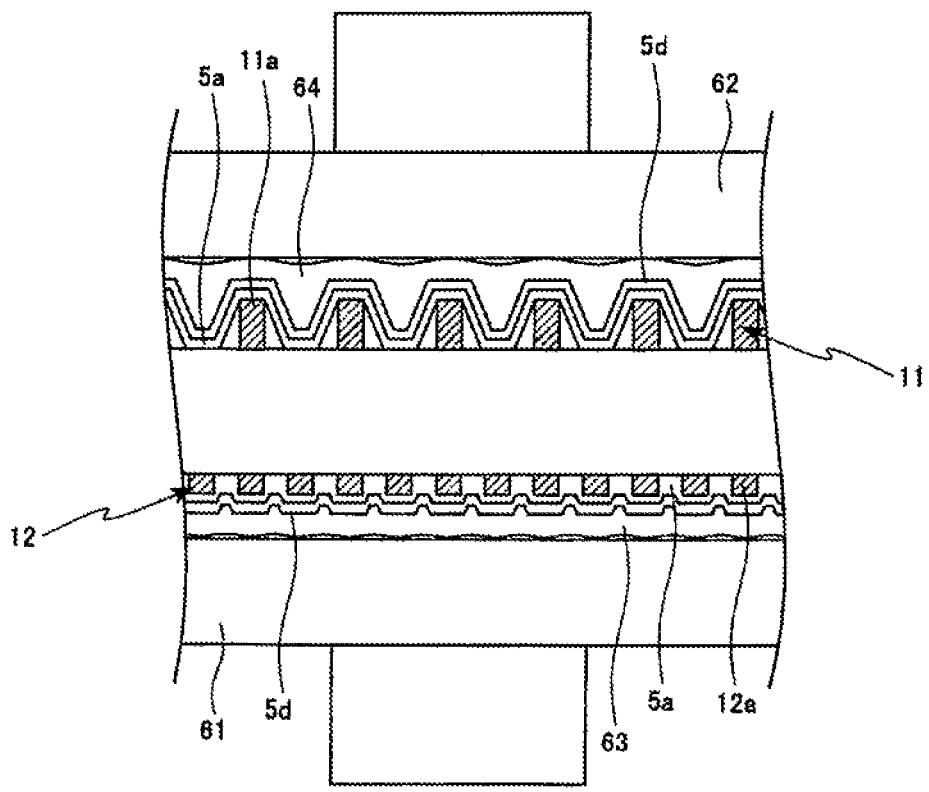
FIG. 3 is a schematic cross-sectional view showing a magnified main part of the step of bonding conductive resin adhesion films according to the first embodiment.
Figure 4:
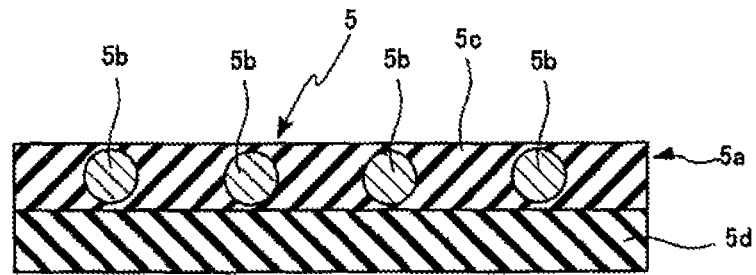
FIG. 4 is a schematic cross-sectional view showing a conductive resin adhesion film according to the first embodiment.
Figure 5:
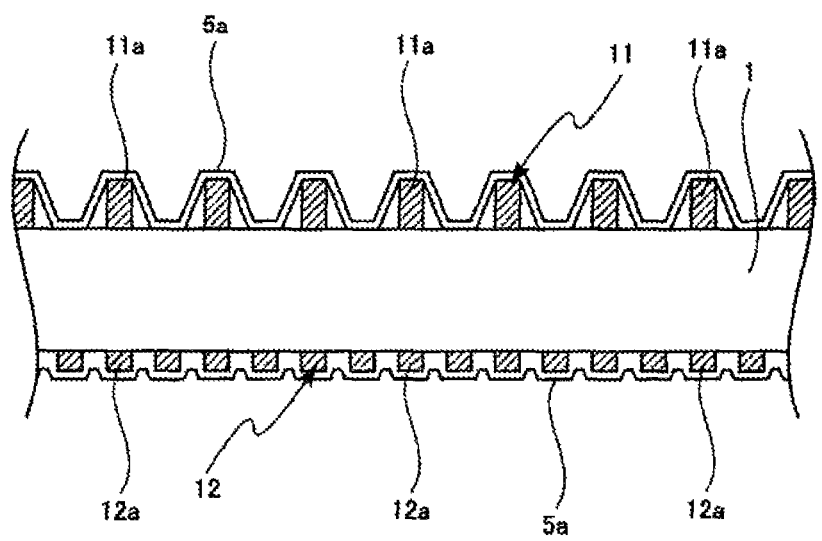
FIG. 5 is a schematic cross-sectional view showing a solar cell on which the conductive resin adhesion films are bonded according to the first embodiment.

FIG. 1 is a cross-sectional view schematically showing a solar cell module according to a first embodiment. FIG. 2 is a side view showing a step of bonding conductive resin adhesion films according to the first embodiment. FIG. 3 is a schematic cross-sectional view showing a magnified main part of the step of bonding conductive resin adhesion films according to the first embodiment. FIG. 4 is a schematic cross-sectional view showing a conductive resin adhesion film used in the first embodiment.

An anisotropic conductive resin adhesion film is used as a resin adhesion film of the first embodiment, for example. As shown in the schematic cross-sectional view of FIG. 4, conductive resin adhesion film 5 at least includes resin adhesion component 5c and conductive particles 5b dispersed in resin adhesion component 5c. This resin adhesion component 5c having conductive particles 5b dispersed therein is provided on base film 5d made of PET (Polyethylene terephthalate) or the like. Resin adhesion component 5c is made of a constituent containing a thermosetting resin such as an epoxy resin, a phenoxy resin, an acrylic resin, a polyimide resin, a polyamide resin, and a polycarbonate resin. One or more of these thermosetting resins are used singularly or in combination. It is preferable to use one or more thermosetting resins selected from a group consisting of an epoxy resin, a phenoxy resin, and an acrylic resin.

Conductive particles used as conductive particles 5b are metal particles such as gold particles, silver particles, copper particles, or nickel particles, or plated particles such as gold-plated particles, copper-plated particles, or nickel-plated particles which are each formed by covering a surface of a conductive or insulating core particle with a conductive layer such as a metal layer.

In this embodiment, PET is used as base film 5d. Resin adhesion layer 5a formed of resin adhesion component 5c and conductive particles 5b is provided on base film 5d. The thickness of resin adhesion layer 5a is about 0.02 mm.

First of all, solar cell module 100 manufactured according to the first embodiment is described with reference to FIG. 1.

Solar cell module 100 includes multiple plate-shaped solar cells 1. For example, each solar cell 1 is formed of a crystalline semiconductor substrate made of monocrystalline silicon, polycrystalline silicon, or the like of about 0.15 mm in thickness, and is shaped like substantially a square having a side of 104 mm or 125 mm. However, solar cell 1 is not limited to the above, but another solar cell may also be used as solar cell 1.

For example, an n-type region and a p-type region are formed in solar cell 1 so that an interface between the n-type region and the p-type region functions as a junction to form an electric field for isolating carriers. Each of the n-type region and the p-type region may be formed by using, singularly or in combination, semiconductor substrates used for solar cells, such as monocrystalline silicon, polycrystalline silicon, and compound semiconductors including GaAs and InP. An example of a solar cell is one including an intrinsic amorphous silicon layer between a monocrystalline silicon substrate and an amorphous silicon layer having opposite conductivities. This configuration makes it possible to reduce defects at the interface between the monocrystalline silicon substrate and the amorphous silicon layer and improve characteristics of the heterojunction interface.

Figure 6:
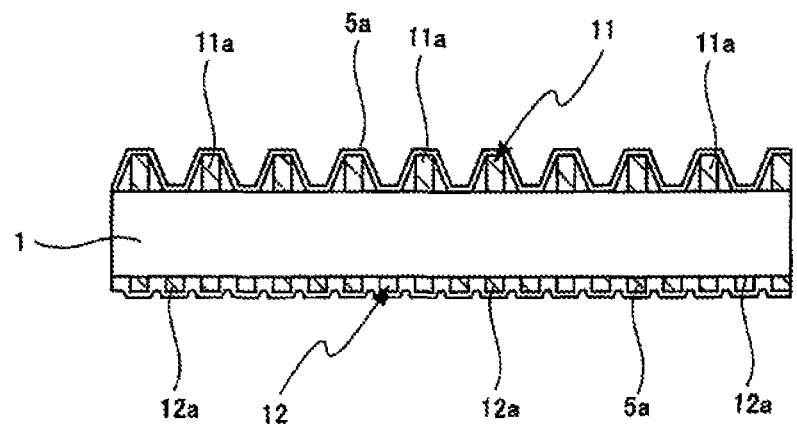
FIG. 6 is another schematic cross-sectional view showing a solar cell on which the conductive resin adhesion films are bonded according to the first embodiment.
Figure 7:
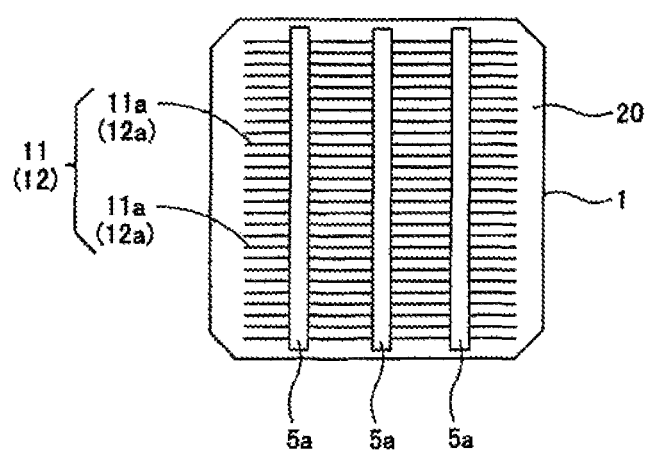
FIG. 7 is a schematic plan view showing a solar cell on which the conductive resin adhesion films are bonded according to the first embodiment.

As shown in a schematic cross-sectional view of FIG. 6 and a plan view of FIG. 7, electrodes 11, 12 are formed in predetermined regions of front and back sides of solar cell 1. These electrodes 11, 12 are electrodes for collecting carriers generated by a photoelectric conversion body of solar cell 1. Electrodes 11, 12 include multiple fine line-shaped electrodes 11a, 12a formed parallel with one another, for example. For example, fine line-shaped electrodes 11a on the front surface of solar cell 1 each have a width of about 100 μm and a thickness of about 60 μm, and about 50 fine line-shaped electrodes 11a are formed on the front surface of the substrate at an interval of about 2 mm. On the other hand, fine line-shaped electrodes 12a on the back surface thereof each have a width of about 100 μm and a thickness of about 10 μm, and about 240 fine line-shaped electrodes 12a are formed on the back surface of the substrate at an interval of about 0.5 mm. These fine line-shaped electrodes 11a, 12a are formed by screen-printing silver paste and then curing the silver paste at a temperature of a hundred and several tens of degrees, for example. Note that electrodes 11, 12 may include bus bar electrodes in the form of polygonal lines having the same thickness and width as the fine line-shaped electrodes.

As described previously, the number of fine line-shaped electrodes 11a of electrode 11 on the front surface is made smaller than the number of fine line-shaped electrodes 12a of electrode 12 on the back surface for the purpose of increasing the amount of light to be incident on the light-receiving surface of solar cell 1. Further, the thickness of each fine line-shaped electrode 11a on the front surface is made larger than the thickness of each fine line-shaped electrode 12a on the back surface. Thereby, the resistance of electrode 11 on the front surface is made small, improving the characteristics of the solar cell.

Wiring members 120 are electrically connected to electrodes 11, 12. Conductive resin adhesion films 5 are used to connect wiring members 120 to electrodes 11, 12. Conductive resin adhesion films 5 are pressure-bonded to positions of solar cell 1 where wiring members 120 are to be bonded. These conductive resin adhesion films 5 to be pressure-bonded each have a width which is the same as or slightly smaller than the width of each wiring member 120 to be connected. For example, if the width of wiring member 120 is in the range of 0.5 mm to 3 mm, the width of conductive resin adhesion film 5 is set equal to or smaller than the width of wiring member 120 within the range of the width of wiring member 120, i.e., 0.5 mm to 3 mm. In this embodiment, as shown in FIG. 7, three adhesion resin film layers 5a are bonded on each of the front and back sides of solar cell 1 at positions where wiring members 120 are to be bonded. Wiring members 120 are bonded to solar cell 1 in such a way that resin adhesion films 5 are respectively arranged on the front and back sides of solar cell 1 and then pressure is applied to press members in directions opposed to each other. As described previously, the number of fine line-shaped electrodes 11a on the front surface of solar cell 1 is smaller than the number of fine line-shaped electrodes 12a on the back surface thereof. For this reason, pressure to be applied to resin adhesion film 5 on the front surface and pressure to be applied to resin adhesion film 5 on the back surface when the pressure is applied to the press members in the directions opposed to each other are different. Thus, the inventors of this application have keenly examined a method of bonding resin adhesion films 5 on the front and back sides of solar cell 1 and have found a method by which the films can be bonded in good condition. This bonding method is described later.

Wiring members 120 are connected to electrodes 11, 12 by applying a heat treatment while pressing wiring members 120 against conductive adhesion films 5 and thereby thermally curing the adhesion layers of conductive resin adhesion films 5.

Note that an example where electrode 12 on the back surface is formed of fine line-shaped electrodes 12a is described in the above description; however, in the case of using a solar cell module of a structure receiving no light on the back surface thereof, a solar cell module of a structure where a metal electrode is provided on the entire back surface is employed.

Figure 9:
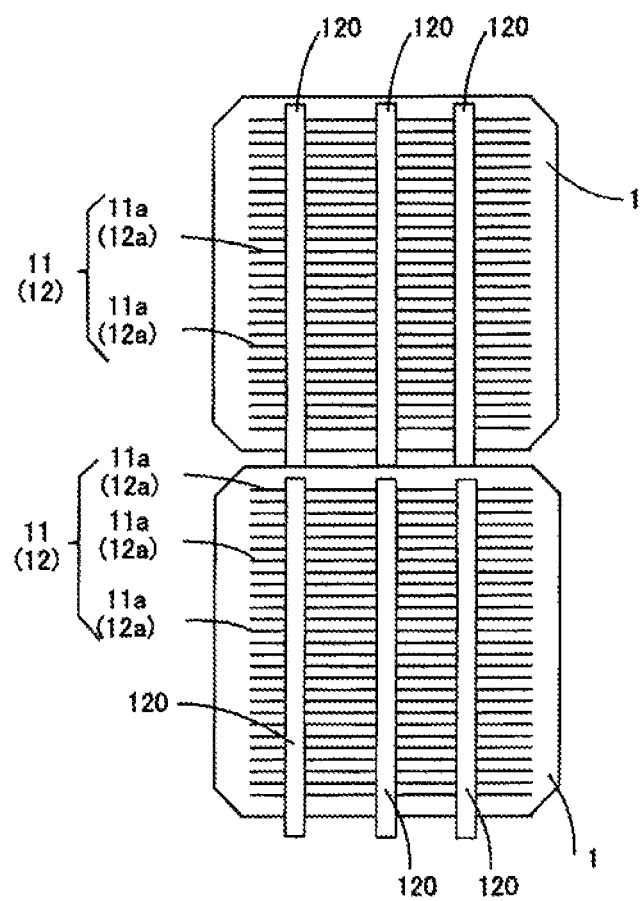
FIG. 9 is a schematic plan view showing the solar cell module made by connecting the electrodes of the solar cell to the wiring members with the conductive resin adhesion films according to the first embodiment.

As shown in the plan views of FIGS. 1 and 9, each of multiple solar cells 1 is electrically connected to another adjacent solar cell 1 with wiring members 120 made of flat copper foil or the like. Specifically, one end of each wiring member 120 is connected to electrode 11 on the upper surface of one of solar cells 1 whereas the other end is connected to electrode 12 on the lower surface of another solar cell 1 adjacent to the one of solar cells 1. Solar cell module 100 has a configuration such that solar cells 1 are connected in series with wiring members 120 and a certain output, e.g., an output of 200 W is taken out from solar cell module 100 to the outside through an output electrode.

As shown in FIG. 1, solar cell string 100a is formed by electrically connecting multiple solar cells 1 to one another with wiring members 120 made of a conductive material such as copper foil. Solar cell string 100a is sealed between translucent or transparent front-surface member 41 such as glass or translucent or transparent plastic and back-surface member 42 made of a member such as weather-resistant film, glass, or plastic, with sealing material 43 such as EVA (ethylene vinylacetate) excellent in weather resistance and humidity resistance.

According to need, solar cell module 100 described above is fitted in an outer frame (not illustrated) made of aluminum or the like by applying a sealing member to the outer periphery of the module. The outer frame is formed of aluminum, stainless steel, a steel-sheet roll-forming material, or the like. If needed, a terminal box (not illustrated) is provided to the front surface of back-surface member 42, for example.

In order to electrically connect wiring members 120 to solar cells 1 described above with resin adhesion layers 5a, as shown in FIGS. 2 and 3, adhesion films 5 are first arranged on front and back electrodes 11, 12 of each solar cell 1, and then pressure is applied to lower press member 61 and upper press member 62 in directions opposed to each other. To apply pressure evenly, first cushion sheet 63 is disposed between lower press member 61 and adhesion film 5 and second cushion sheet 64 is disposed between upper press member 62 and adhesion film 5. Adhesion films 5 are pressed against electrodes 11, 12 through first and second cushion sheets 63, 64.

Resin adhesion layers 5a are bonded on front and back electrodes 11, 12 of solar cell 1 by pressure-bonding conductive adhesion films 5 on electrodes 11, 12 respectively and then detaching base film 5d from each resin adhesion layer 5a. A resin adhesive used as a resin adhesion component of conductive resin adhesion layer 5a is one containing a cross-linking accelerator including mainly an epoxy resin and formulated to rapidly accelerate cross-linkage by a heating process at a temperature of 180° C. and complete curing in approximately 15 seconds. The thickness of conductive resin adhesion film layer 5 is 0.01 mm to 0.05 mm. The width thereof is preferably the same as or smaller than the width of wiring member 120 in view of blockage of incident light. Conductive resin adhesion film 5 used in this embodiment is formed in a strip-shaped film sheet having a width of 1.5 mm and a thickness of 0.02 mm.

Figure 10:
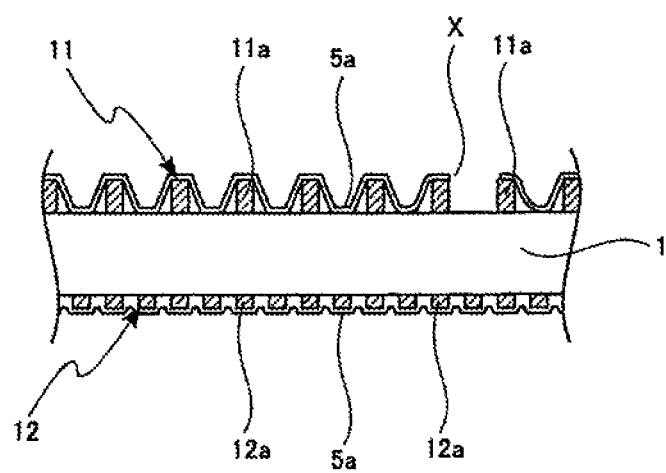
FIG. 10 is a schematic cross-sectional view showing a solar cell on which conductive resin adhesion films are bonded with a conventional method.

As described above, the number of fine line-shaped electrodes 11a on the front surface of solar cell 1 is smaller than the number of fine line-shaped electrodes 12a on the back surface thereof. For this reason, as shown in FIG. 10, when the pressure is applied to the press members in the directions opposed to each other, the total contact surface area of electrode 11 and resin adhesion layer 5a provided on the front surface side of solar cell 1 differs from the total contact surface area of electrode 12 and resin adhesion layer 5a provided on the back surface side of solar cell 1.

The difference in the total contact surface area makes pressure application uneven so that the resin adhesion film having a smaller contact surface area receives more pressure. If the pressure is applied to the electrode 12 in a concentrated manner, there is a drawback that resin adhesion layer 5a in the electrode 11 is broken as shown in a x part, causing bonding failure.

Further, to apply pressure evenly, first cushion sheet 63 is disposed between lower press member 61 and adhesion film 5 and second cushion sheet 64 is disposed between upper press member 62 and adhesion film 5. However, because the number of fine line-shaped electrodes 11a on the front surface differs from the number of fine line-shaped electrodes 12a on the back surface, the total surface area in which cushion sheet 63 contacts the electrode differs from the total surface area in which cushion sheet 64 contacts the electrode.

Because the number of electrodes 11 on the front surface is smaller, the area in which cushion sheet 64 contact electrode 11 is smaller than the area in which cushion sheet 63 contacts electrode 12 on the back surface. Since the pressure is applied to press members 61, 62 in the directions opposed to each other, the pressure applied to each fine line-shaped electrode 11a on the front surface is larger than each fine line-shaped electrode 12a on the front surface if cushion sheets 63, 64 are of the same material and thickness. This pressure difference sometimes causes adhesion film 5 on the front surface side to be partially pressure-bonded to fine line-shaped electrodes 11a and produces a portion where resin adhesion layer 5a is thin. If such a thin portion exists in resin adhesion layer 5a, there may be a case where resin adhesion layer 5a at this portion is broken when base film 5d is detached, and is exfoliated from fine line-shaped electrode 11a together with base film 5d without being detached from base film 5d, thus causing bonding failure of resin adhesion layer 5a as shown in the x part of FIG. 10.

To cope with this, the inventors of this application have examined the thickness of cushion sheets 63, 64 so that the pressure can be applied to fine line-shaped electrodes 11a evenly, and thus have found the way to solve this bonding failure.

Using a silicone rubber sheet as each of first and second cushion sheets 63, 64, the condition of how resin adhesion layer 5a is bonded to front and back electrodes 11, 12 of solar cell 1 is checked as the thickness of each of these silicone rubber sheets is changed.

Solar cell 1 used in this embodiment is formed of a crystalline semiconductor substrate made of monocrystalline silicon having a thickness of 0.15 mm, and is shaped like substantially a square having a side of 125 mm. Electrodes 11, 12 are formed in predetermined regions of front and back sides of solar cell 1. Electrodes 11, 12 include multiple fine line-shaped electrodes 11a, 12a formed parallel with one another, for example. For example, about 50 fine line-shaped electrodes 11a are formed on the front surface of the substrate at a pitch of about 2 mm, and each fine line-shaped electrode 11a on the front surface of solar cell 1 has a width of about 100 µm and a thickness of about 60 µm. On the other hand, about 240 fine line-shaped electrodes 12a are formed on the back surface of the substrate at a pitch of about 0.5 mm, and each fine line-shaped electrode 12a on the back surface thereof has a width of about 100 µm and a thickness of about 10 µm.

Resin adhesion films 5 are arranged on front and back electrodes 11, 12 of solar cell 1 described above. Then, first cushion sheet 63 made of a silicone rubber sheet and lower press member 61 are arranged below lower resin adhesion film 5 in this order, and second cushion sheet 64 made of a silicone rubber sheet and upper press member 62 are arranged above upper resin adhesion film 5 in this order. Pressure is applied to lower press member 61 and upper press member 62 in directions opposed to each other, and thereby resin adhesion films 5 are pressure-bonded to front and back electrodes 11, 12 of solar cell 1. Here, lower press member 61 and upper press member 62 pinch these components with a pressure of 0.50 MPa.

Four types of silicone rubber sheets of 200 µm, 300 µm, 400 µm, and 450 µm thicknesses are prepared. The first and second cushion sheets are pinched and pressed between lower press member 61 and upper press member 62, using a silicone rubber sheet of 200 µm thickness as first cushion sheet 63 and a silicone rubber sheet of 200 µm, 300 µm, 400 µm, or 450 µm thickness as second cushion sheet 64. Table 1 shows this result.

TABLE 1

| | Sheet Thickness (µm) | | | |
|---|---|---|---|---|
| First Cushion sheet 63 | 200 | 200 | 200 | 200 |
| Second Cushion sheet 64 | 200 | 300 | 400 | 450 |
| Bonding Condition | Poor | Good | Good | Good |

When silicone rubber sheets of the same thickness are used as first and second cushion sheets 63, 64 on the upper and lower sides, the pressure applied on fine line-shaped electrodes 11a of upper electrode 11 is larger, causing bonding failure of resin adhesion layer 5a. On the other hand, when upper second cushion sheet 64 having a thickness of 300 µm, 400 µm, or 450 µm is employed, i.e., when the thickness of second cushion sheet 64 is larger than the thickness of lower first cushion sheet 63 (200 µm), second cushion sheet 62 is bent or deformed more than first cushion sheet 63 and follows the shape of the front surface of solar cell 1. Hence, it is possible to apply the pressure to fine line-shaped electrodes 11a evenly and prevent the concentration of the pressure. As a result, it can be confirmed that resin adhesion layers 5a are reliably bonded to front and back electrodes 11, 12 of solar cell 1.

As described above, making the thickness of upper second cushion sheet 64 larger than the thickness of lower first cushion sheet 63 causes second cushion sheet 64 to follow the shape of the front surface of solar cell 1, and thereby makes it possible to apply the pressure to fine line-shaped electrodes 11a evenly and reliably bond resin adhesion layers 5a to front and back electrodes 11, 12 of solar cell 1. The thickness of upper second cushion sheet 64 is preferably 1.2 times or larger than, or more preferably 1.5 times or larger than the thickness of lower first cushion sheet 63. Because too thick cushion sheet 64 increases the material ratio of the cushion sheets, the thickness of cushion sheet 64 is preferably 1.5 times or larger than and 2.5 times or smaller than the thickness of cushion sheet 63.

In addition, although a silicone rubber sheet is used in the above embodiment, the same effect can be obtained by using another elastic sheet.

Further, although electrodes 11, 12 are formed using silver paste, electrodes 11, 12 formed by plating or the like also bring about the same effect.

Next, a description is given of a method of bonding wiring members 120 to solar cell 1 on which conductive resin adhesion films 5 are bonded.

Figure 8:
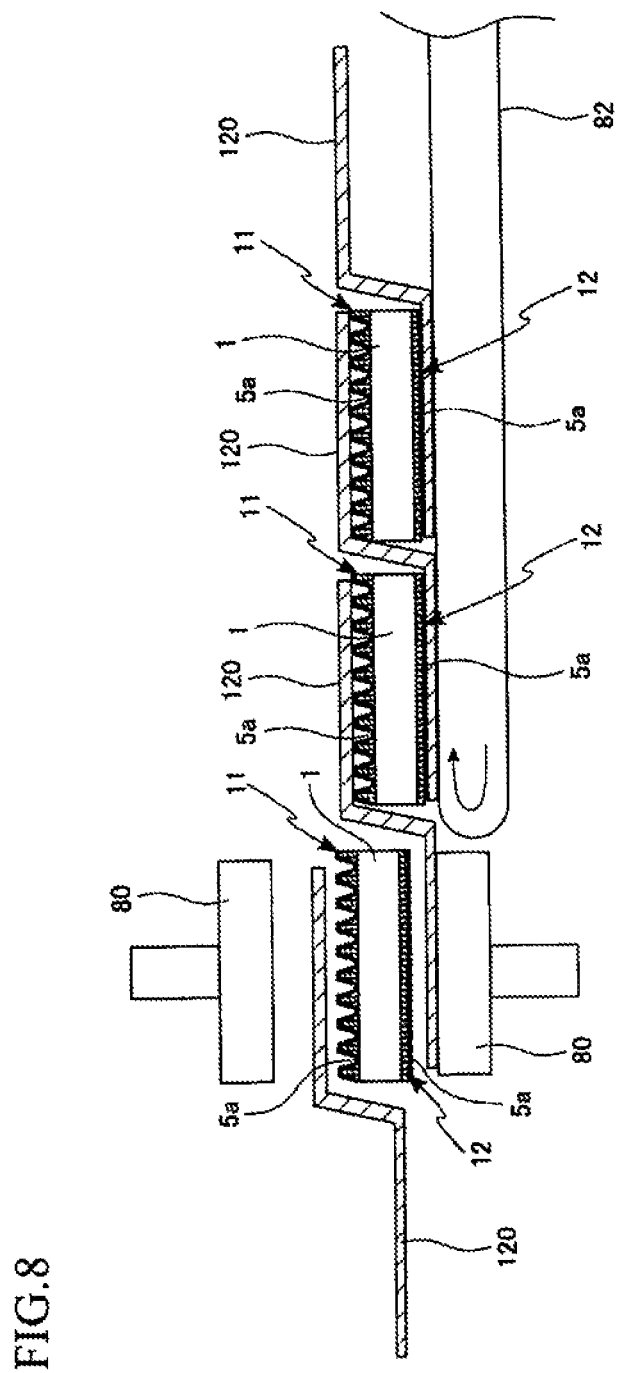
FIG. 8 is a schematic view showing steps in a method of manufacturing a solar cell module according to the invention which is made by connecting electrodes of a solar cell to wiring members with the conductive resin adhesion films according to the first embodiment.

Wiring members 120 are placed on conductive resin adhesion layers 5a, 5a which are bonded to the front and back sides of solar cell 1. Then, as shown in FIG. 8, wiring members 120 are pressure-bonded to and fixed provisionally on electrodes 11, 12. In the step of provisionally fixing wiring members 120, for example, heater blocks 80, 80 are pressed with a pressure of about 0.5 MPa to press wiring members 120, 120 toward solar cell 1. Thereafter, wiring members 120 are provisionally fixed by heating heater blocks 80, 80 to a low temperature such that the resin adhesion component would not be thermally cured, e.g., to a temperature of approximately 90° C. After that, solar cells 1 on which wiring members 120 are provisionally fixed are aligned to form a string. Solar cells 1 on which wiring members 120 are provisionally fixed are then conveyed in sequence by conveyer 82.

Subsequently, the string in which wiring members 120 are provisionally fixed is heated while the wiring members are pressed toward solar cells 1 again, thereby curing the resin adhesion component and fully pressure-bonding wiring members 120 to solar cells 1.

The string in which multiple solar cells 1 are connected to one another with wiring members 120 is sandwiched between front-surface member 41 made of glass and back-surface member 42 made of a material such as weather-resistant film, glass, or transparent plastic via translucent or transparent sealing-material sheets 43a, 43b such as EVA. Then, solar cells 1 are sealed between front-surface member 41 and back-surface member 42 by a laminating device by use of the sealing-material sheets. Thereafter, the string thus sealed is put in a furnace and heated at a temperature of approximately 150° C. for about 10 minutes. This accelerates the cross-linking reaction and enhances the adhesion between sealing material 43 (sealing-material sheets) and front- and back-surface members 41, 42. As a result, the solar cell module as shown in FIG. 1 is manufactured.

Note that, the above embodiment describes an example where three wiring members 120 arranged on each solar cell 1 are used to connect solar cells 1 to each other. However, the number of wiring members 120 is not limited to three. The invention is applicable to any case where wiring members 120 are arranged on front and back sides of solar cell 1 irrespective of the number of wiring members 120.

Figure 19:
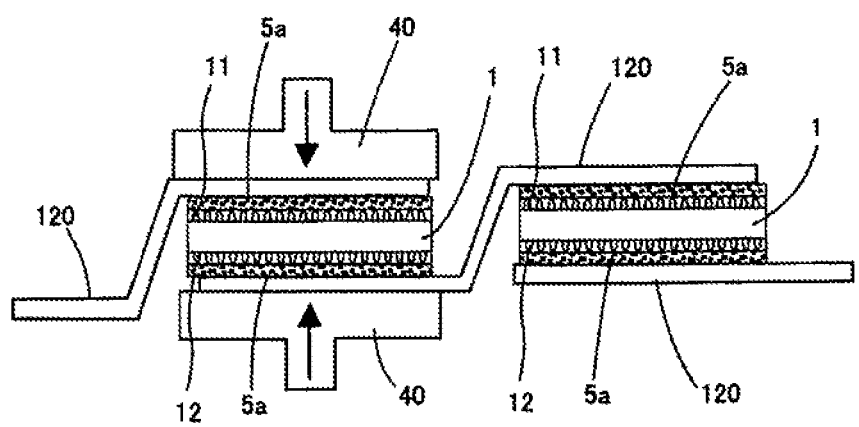
FIG. 19 is a schematic view showing a conventional provisional pressure-bonding step.
Figure 20:
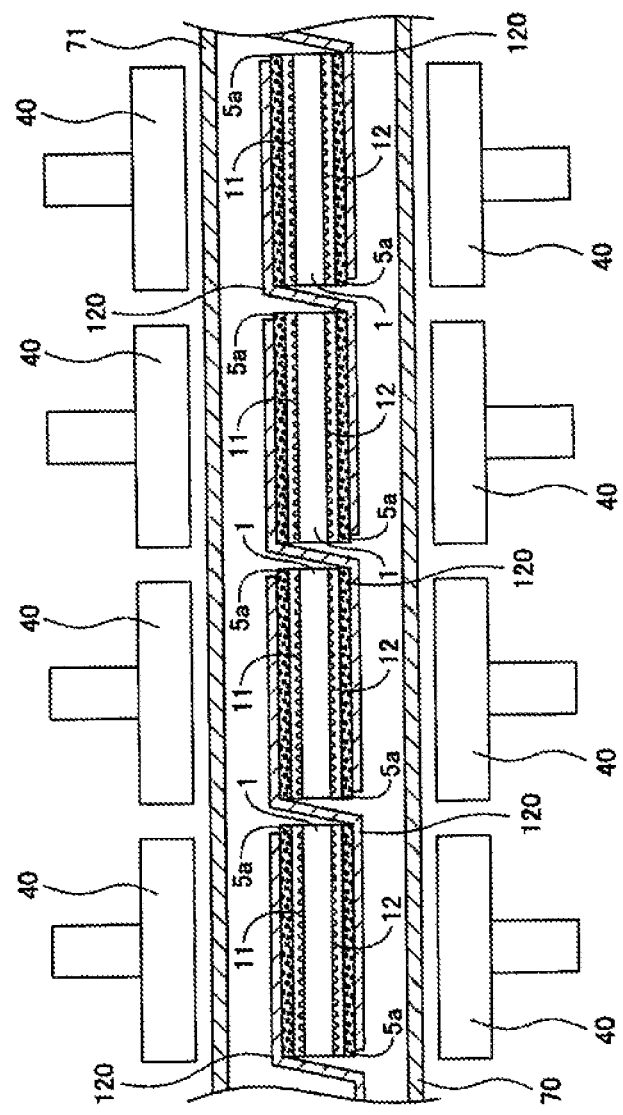
FIG. 20 is a schematic view showing a conventional full pressure-bonding step.

With reference to FIGS. 19 and 20, a description is given of an example of a method of connecting wiring members to electrodes of a solar cell by use of conductive resin adhesion films as a resin adhesive.

First, resin adhesion layers 5a, 5a are bonded on electrodes 11, 12 of solar cell 1 by pressure-bonding conductive resin adhesion films 5 on electrodes 11, 12 respectively and then detaching the base film from the resin adhesion layer 5a of each adhesion film 5. Then, as shown in FIG. 19, while wiring members 120, 120 are arranged above and below solar cell 1 on which resin adhesion layers 5a, 5a are bonded, heater blocks 40, 40 press them to press wiring members 120 toward solar cell 1. Thereafter, wiring members 120 are provisionally fixed on solar cell 1 by heating heater blocks 40, 40 to a temperature such that the resin adhesion component of resin adhesion layer 5a would not be thermally cured and such that solar cells 1, 1 are aligned.

After that, the process proceeds to the step of fully pressure-bonding wiring members 120. Specifically, as shown in FIG. 20, solar cells 1, 1 on which wiring members 120 are provisionally pressure-bonded are pressed with high temperature and high pressure by heater blocks 40, 40. Here, sheets 70, 71 having a releasing function are placed between heater blocks 40 and provisionally-bonded solar cells 1, 1. Wiring members 120 are pressed toward solar cell 1 by using heater blocks 40, 40 heated to a temperature high enough to thermally cure the resin adhesion component or higher. Thereby, the resin adhesion component is thermally cured, and electrodes 11, 12 of solar cell 1 and wiring members 120 are connected with resin adhesion layers 5a, thus forming a solar cell string. A sheet made of PTFE (polytetrafluoroethylene) may be used as sheets 70, 71.

Next, a second embodiment is described. A solar cell and a solar cell module according to the second embodiment are the same or similar to as solar cell 1 and solar cell module 100 according to the first embodiment.

Figure 11:
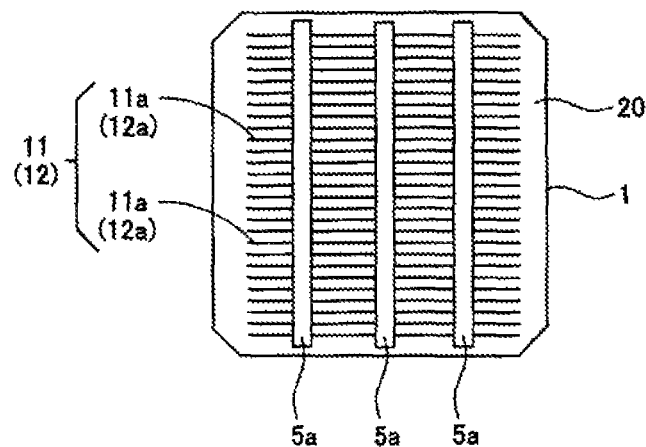
FIG. 11 is a plan view of a solar cell on which resin adhesion films are bonded.
Figure 12:
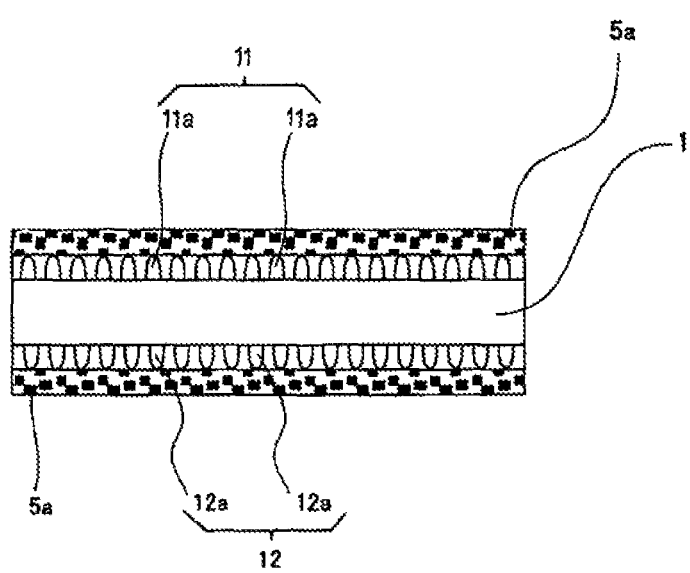
FIG. 12 is a schematic cross-sectional view of the solar cell on which the resin adhesion films are bonded.

In the second embodiment, multiple solar cells 1 described above are electrically connected to one another with wiring members 120 made of a conductive material such as flat copper foil by use of conductive resin adhesion layers 5a as a resin adhesive. To this end, as shown in FIGS. 11 and 12, conductive resin adhesion layers 5a are first bonded on each of front and back electrodes 11, 12 of solar cell 1 at positions where wiring members 120 are to be connected. More specifically, conductive resin adhesion layers 5a are bonded to cover all multiple fine line-shaped electrodes 11a, 12a. An anisotropic conductive adhesion film is used as conductive resin adhesion layers 5a. The thickness of each conductive resin adhesion layer 5a is 0.01 mm to 0.05 mm. The width thereof is preferably the same as or smaller than the width of wiring member 120 in view of blockage of incident light. The anisotropic conductive adhesion film used in this embodiment is formed in a strip-shaped film sheet having a width of 1.5 mm and a thickness of about 0.02 mm.

Figure 13:
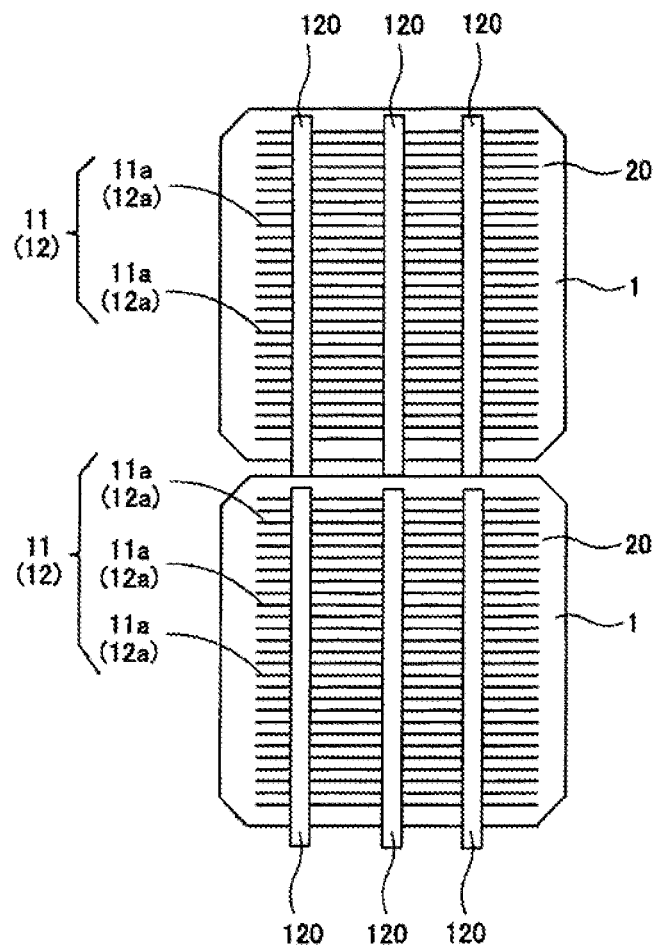
FIG. 13 is a plan view showing solar cells to which wiring members are connected.
Figure 14:
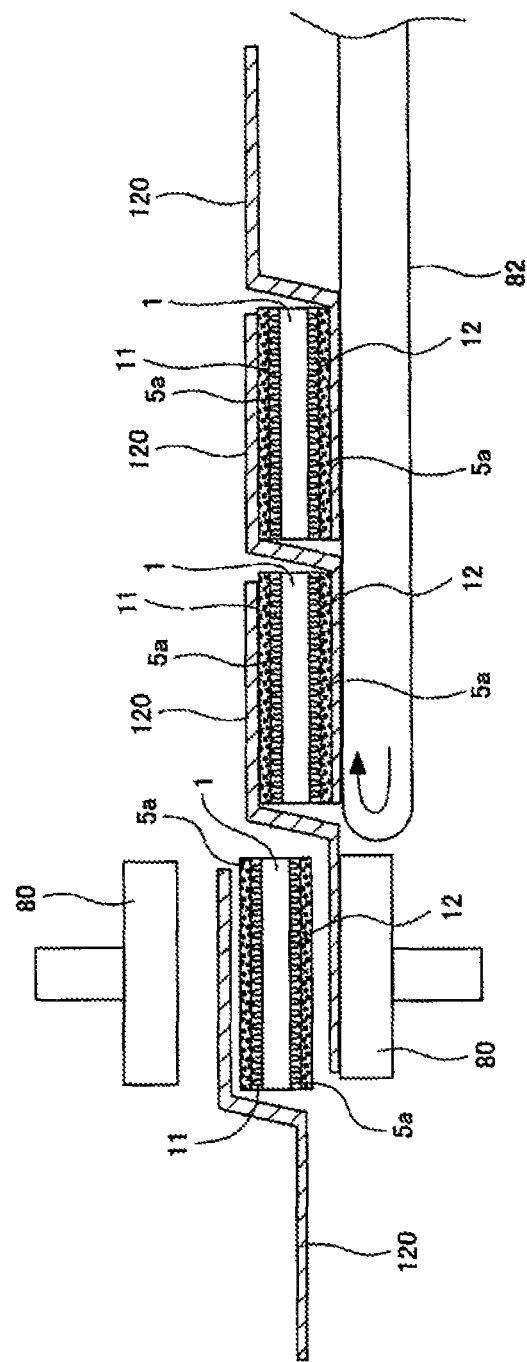
FIG. 14 is a schematic cross-sectional view showing a provisional pressure-bonding step according to a second embodiment.

As shown in FIG. 13, each of multiple solar cells 1 is electrically connected to another adjacent solar cell 1 with wiring members 120. Specifically, wiring members 120 are arranged on conductive resin adhesion layers 5a, 5a bonded on each of the front and back sides of solar cell 1, in such a way that one end of each wiring member 120 is connected to electrode 11 on the upper surface of one of solar cells 1 whereas the other end is connected to electrode 12 on the lower surface of another solar cell 1 adjacent to the one solar cell 1. Then, as shown in FIG. 14, wiring members 120 are pressure-bonded to conductive resin layers 5a, 5a and provisionally fixed on electrodes 11, 12. In the step of provisionally fixing wiring members 120, for example, heater blocks 80, 80 are pressed with a pressure of about 0.5 MPa to press wiring members 120, 120 toward solar cell 1. Thereafter, wiring members 120 are provisionally fixed by heating heater blocks 80, 80 to a low temperature such that the resin adhesion component would not be thermally cured, e.g., to a temperature of approximately 90° C. After that, solar cells 1, 1 on which wiring members 120 are provisionally fixed are aligned to form a string. Solar cells 1 on which wiring members 120 are provisionally fixed are then conveyed in sequence by conveyer 82.

Here, any suitable method may be used for the pressure-bonding and heating according to situations, including a method in which a metal block incorporating therein a heater is pressed with a certain pressure and heated to a certain temperature and a method in which a press member such as a press pin and blowing hot air are used to press with a certain pressure and heat to a certain temperature, for example.

Figure 15:
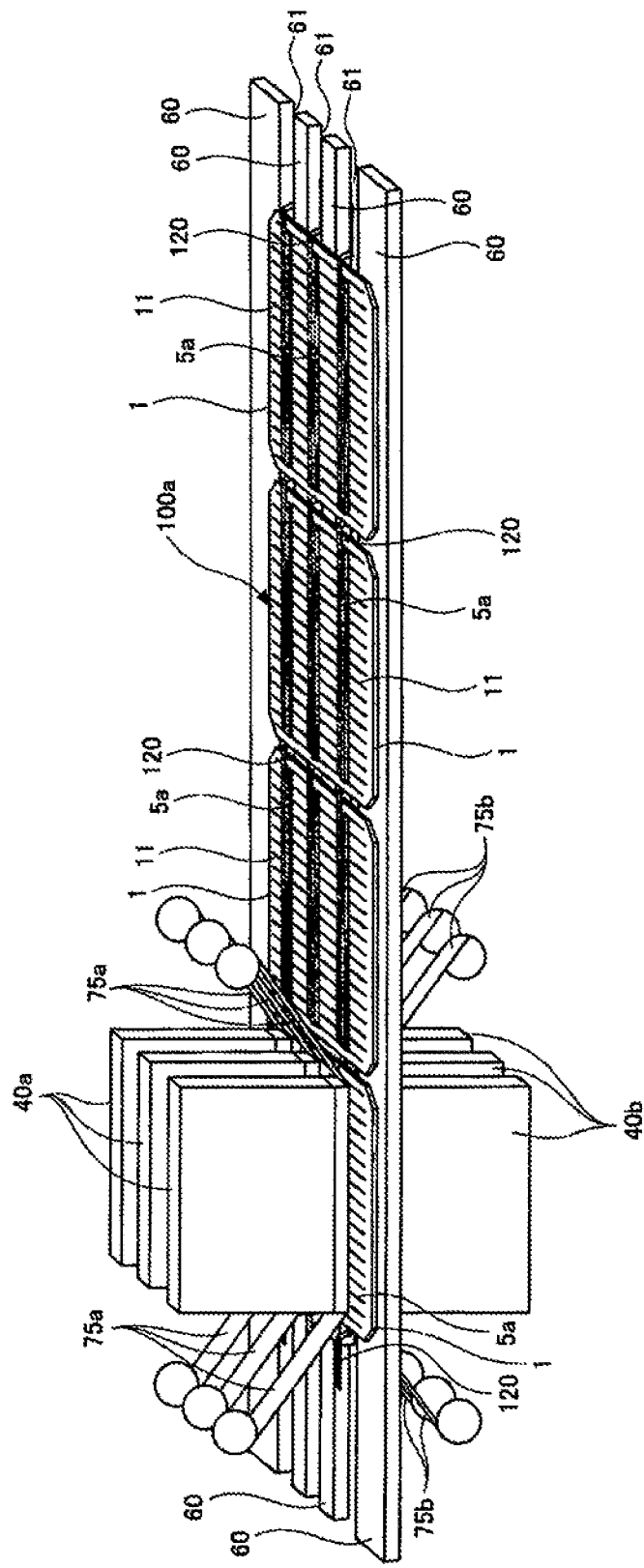
FIG. 15 is a schematic perspective view showing a full pressure-bonding step according to the second embodiment.
Figure 16:
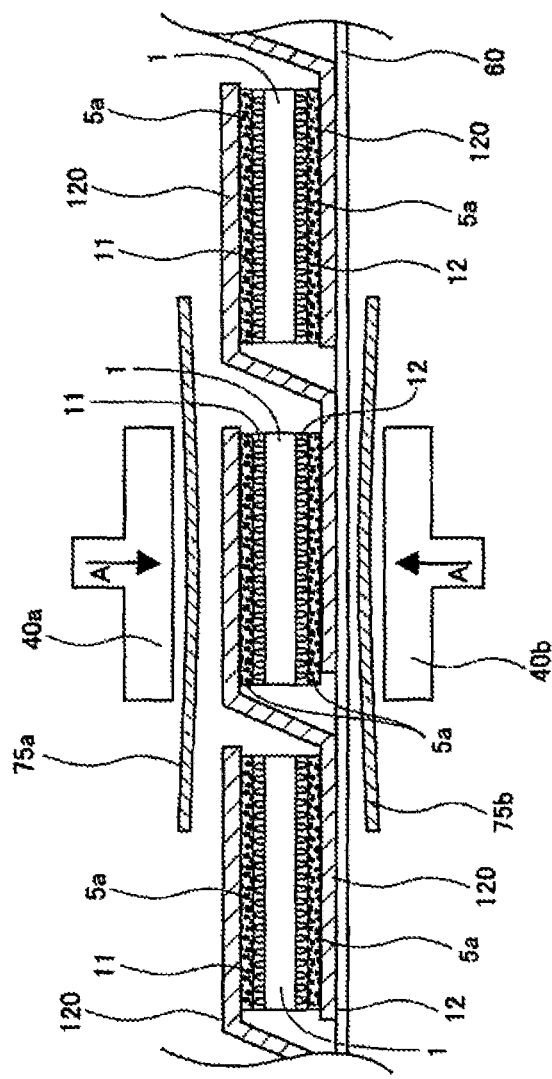
FIG. 16 is a schematic cross-sectional view showing the full pressure-bonding step according to the second embodiment.

Subsequently, a step of fully pressure-bonding wiring members 120 is carried out. The full pressure-bonding step is described with reference to FIGS. 15 to 18. In the step of fully pressure-bonding and fixing wiring members 120, as shown in FIGS. 15 and 16, provisionally-fixed solar cell string 100a is conveyed on conveyer belt 60 to a position between upper heater blocks 40a and lower heater blocks 40b serving as a press member carrying out the pressure-bonding step. Conveyer belt 60 has slits 61 at positions opposed to wiring members 120. Lower silicone rubber sheets 75b as a second cushion sheet and lower heater blocks 40b are disposed facing these slits 61. Moreover, upper silicone rubber sheets 75a as a first cushion sheet are disposed between solar cell string 100a and upper heater blocks 40a. At the time of pressing, lower silicone rubber sheets 75b and lower heat blocks 40b are inserted into slits 61. When the full pressure-bonding step is carried out, upper heater blocks 40a and lower heater blocks 40b move in directions indicated by the arrows A to apply pressure to solar cell 1 with silicone rubber sheets 75a, 75b interposed therebetween.

In this embodiment, silicone rubber sheets 75a, 75b of the same material are interposed between upper heater blocks 40a and wiring members 120 and between lower heater blocks 40b and wiring members 120. Since silicone rubber sheets 75a, 75b have cushioning properties, they are used to absorb an influence of unevenness caused by electrodes 11, 12, for example, achieving even application of pressure. Further, since silicone rubber sheets 75a, 75b have cushioning properties, the breakage of solar cell 11 during the step can also be suppressed.

When provisionally-fixed solar cell string 100a is conveyed toward a position between upper and lower heater blocks 40a, 40b, upper and lower heater blocks 40a, 40b are moved away from solar cell 1, as shown in FIG. 16. Likewise, silicone rubber sheets 75a, 75b are also moved away from solar cell 1.

Figure 17:
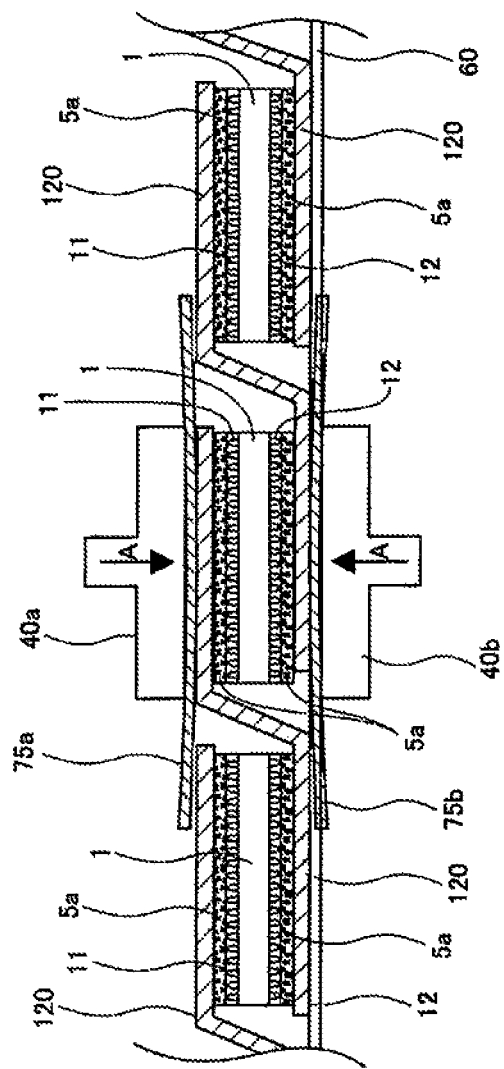
FIG. 17 is another schematic cross-sectional view showing the full pressure-bonding step according to the second embodiment.
Figure 18:
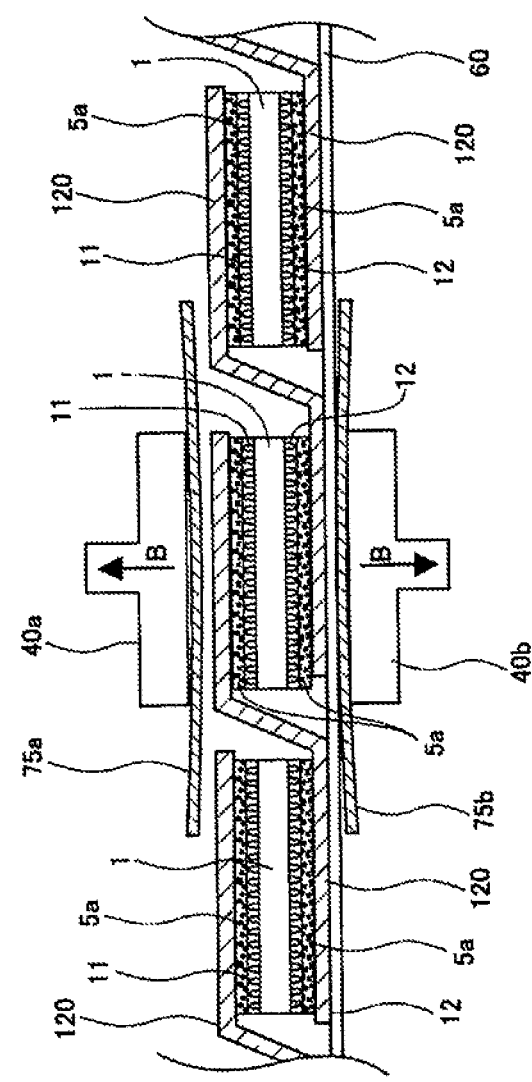
FIG. 18 is still another schematic cross-sectional view showing the full pressure-bonding step according to the second embodiment.

Once solar cell 1 and wiring members 120 to be fully pressure-bonded and fixed arrive at the position between upper and lower heater blocks 40a, 40b, upper and lower heater blocks 40a, 40b move in the directions indicated by the arrows A shown in FIG. 16 to pressure-bond wiring members 120 and solar cell 1 with silicone rubber sheets 75a, 75b interposed therebetween. Then, as shown in FIG. 17, upper and lower heater blocks 40a, 40b press wiring members 120 and solar cell 1 with silicone rubber sheets 75a, 75b interposed therebetween, with a pressure larger than that in the provisional pressure-bonding step, e.g., with a pressure of about 5 MPa, to press wiring members 120, 120 toward solar cell 1. In this event, lower heater blocks 40b and silicone rubber sheets 75b located closer to conveyer belt 60 protrude toward solar cell 1 through slits 61 in conveyer belt 60 to press wiring members 120 and solar cell 1. Thereafter, wiring members 120 are fully pressure-bonded and fixed by heating upper and lower heater blocks 40a, 40b to a temperature high enough to thermally cure the resin adhesion component, e.g., to a temperature equal to or higher than 120° C. and equal to or lower than 200° C. Thereby, solar cells 1 on which wiring members 120 are fixed with thermally-cured resin adhesion layers 5 are electrically connected and aligned.

After the full pressure-bonding step is over, upper and lower heater blocks 40a, 40b move away from solar cell 1 by moving in directions indicated by the arrows B. In this event, silicone rubber sheets 75a, 75b also move in directions away from solar cell 1.

In the full pressure-bonding step described above, upper and lower silicone rubber sheets 75a, 75b stick to the front and back surfaces of solar cell 1 with a certain force. Owing to this, when upper and lower heater blocks 40a, 40b move in the directions indicated by the arrows B shown in FIG. 18 to move away from solar cell 1, a force occurs on the upper side of solar cell 1 and a force occurs on the lower side of solar cell 1 balance out. This prevents solar cell string 100a from being lifted upward.

Figure 21:
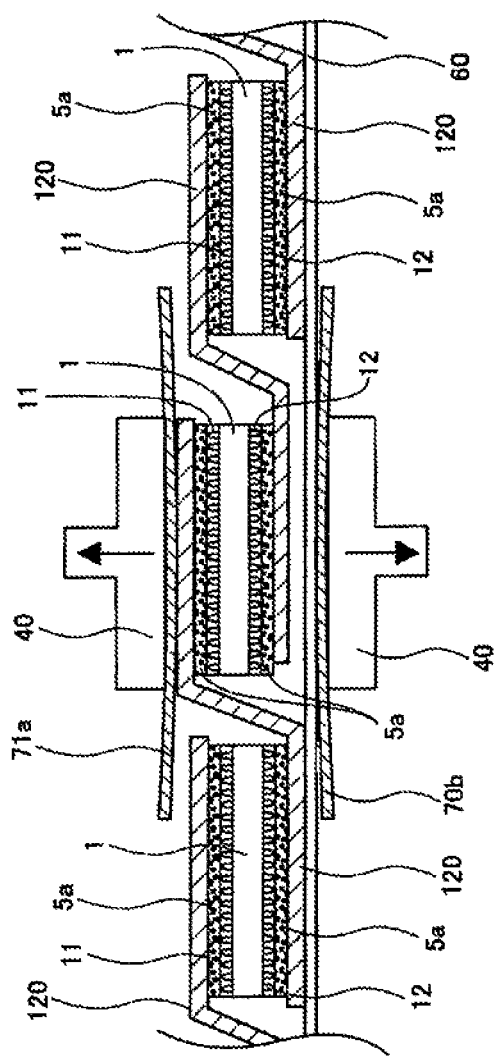
FIG. 21 is a schematic cross-sectional view showing a problem in a conventional way.

Here, if solar cell string 100a is lifted upward as shown in FIG. 21, this causes failure such as bending of wiring member 120 and connection failure of wiring member 120.

In the meantime, in the case of the technique shown in FIG. 20, sheets 70, 71 having a releasing function, such as a sheet made of PTFE (polytetrafluoroethylene), are placed between heater blocks 40 and provisionally-bonded solar cells 1, 1. The sheets made of such a material do not have enough cushioning properties and thus may cause the breakage of solar cell 1 in the full pressure-bonding step.

Accordingly, the second embodiment described above makes it possible to suppress the breakage of solar cell 1 and prevent solar cell 1 from being lifted upward after the full pressure-bonding step, and thereby to improve the manufacturing yield of a solar cell module.

As described previously, the sheets placed between heater blocks 40a, 40b and solar cell 1 preferably have cushioning properties in order to suppress the breakage of solar cell during the full pressure-bonding step. In addition, in order to prevent solar cell from being lifted upward after the full pressure-bonding step, sheet 75b provided below solar cell 1 preferably has adhesive strength at least equal to or larger than sheet 75a provided above solar cell 1. As such a combination of upper sheet 75a and lower sheet 75b, a fluorinated rubber sheet or a PET sheet may be used as upper sheet 75a and a silicone rubber sheet, an acrylic rubber sheet, or the like may be used as lower sheet 75b, in addition to the combination of the silicone rubber sheets described in the above embodiment.

Meanwhile, the adhesive strength of silicone rubber sheets 75a, 75b becomes larger as the temperature at the time of pressure-bonding becomes higher. Using these characteristics, it is preferable to make the actual temperature of lower heater block 40b higher than the actual temperature of upper heater block 40a and thereby make the adhesive strength of lower silicone rubber sheet 75b slightly larger in order to prevent solar cell 1 from being lifted upward. By making the actual temperature of lower heater block 40b higher than the actual temperature of upper heater block 40a in this manner, the same sheet can be used for upper sheet 75a and lower sheet 75b.

Besides, conveyer belt 60 is placed below solar cell 1. Hence, even when silicone rubber sheet 75b sticks to the lower side of solar cell 1, solar cell 1 is supported by conveyer belt 60 and thus silicone rubber sheet 75b is detached from solar cell 1, preventing further downward movement of solar cell 1. As a result, it is possible to prevent solar cell string 100a from being lifted and from being moved downward of conveyer belt 60.

One of methods of making different the actual temperatures of upper and lower heater blocks 40a, 40b is a method of making the heating temperature of lower heater block 40b higher than the heating temperature of upper heater block 40a. Another method is a method of making the thermal capacity of lower heater block 40b larger than the thermal capacity of upper heater block 40a while keeping the heating temperatures of the heaters the same. Since the actual temperature becomes higher as the thermal capacity becomes larger with the same temperatures of the heaters, the actual temperature of lower heater block 40b can be made higher.

Note that, although the second embodiment described above employs an anisotropic conductive adhesion film as a resin adhesion film, one containing no conductive particles may also be used as a resin film. When a resin adhesive containing no conductive particles is used, an electrical connection is established by bringing a part of the front surface of electrode 11 (12) into direct contact with the front surface of wiring member 120. In this case, it is preferable to use wiring member 120 made by forming a conductive film softer than electrode 11 (12), such as tin (Sn) or solder, on the front surface of a conductor such as a copper foil plate, and to establish a connection by making a part of electrode 11 (12) penetrate the conductive film.

Further, resin adhesion layer 5a using adhesive paste in the form of paste may be employed instead of resin adhesion layer 5a formed of an adhesion film in the form of film. For example, anisotropic conductive paste may be used to connect the wiring member.

While sandwiched between transparent sealing-material sheets 43a, 43b such as EVA, a string in which multiple solar cells 1 are connected to one another with wiring members 120 in this manner is sandwiched between front-surface member 41 made of glass and back-surface member 42 made of a material such as weather-resistant film, glass, or transparent plastic so that they overlap one another. Then, solar cells 1 are sealed between front-surface member 41 and back-surface member 42 by a laminating device by use of the sealing-material sheets. Thereafter, the string thus sealed is put in a furnace and heated at a temperature of approximately 150° C. for about 10 minutes. This accelerates the cross-linking reaction and enhances the adhesion between sealing material 43 (sealing-material sheets) and front- and back-surface members 41, 42. As a result, the solar cell module as shown in FIG. 1 is manufactured.

It should be understood that the embodiments disclosed herein are exemplary in all points and do not limit the invention. The scope of the invention is defined not by the descriptions of the embodiments described above but by claims, and it is intended that the scoped of the invention includes equivalents of claims and all modifications within the scope of claims.

EXPLANATION OF REFERENCE NUMERALS

1 solar cell
11, 12 electrode 11a, 12a fine line-shaped electrode
5 resin adhesion film
5a resin adhesion layer
40a upper heat block
40b lower heat block
61 lower press member
62 upper press member
63 first cushion sheet
64 second cushion sheet
75a, 75b silicone rubber sheet
120 wiring member

The invention claimed is:

1. A method of manufacturing a solar cell module including a step of electrically connecting wiring members to a front-surface electrode and a back-surface electrode of a solar cell by use of resin adhesives, the method comprising:
arranging a resin adhesive, a first wiring member, a first cushion sheet, and an upper press member on the front-surface electrode of the solar cell in this order and arranging a resin adhesive, a second wiring member, a second cushion sheet, and a lower press member on the back-surface electrode of the solar cell in this order,
the upper press member and the lower press member are formed of an upper heat block to be located above the solar cell and a lower heat block to be located below the solar cell, and
fixing the wiring members to the front-surface electrode and the back-surface electrode by pressing the wiring members via the first and second cushion sheets by applying pressure to the upper heat block and the lower heat block in directions opposed to each other, and then by thermally curing the resin adhesives by heating at a temperature equal to or higher than a curing temperature of the resin adhesives, and
detaching the first cushion sheet from the solar cell by releasing the pressure to the press members, and moving the upper press member upward while keeping at least the second cushion sheet sticking to the solar cell under conditions wherein the second cushion sheet has adhesive strength larger than that of the first cushion sheet
wherein,
in the step of fixing the wiring members to the front-surface electrode and the back-surface electrode, the wiring members are pressed and heated with the upper heat block and the lower heat block, and
in the step of fixing the wiring members to the front-surface electrode and the back-surface electrode, the wiring members are fixed to the solar cell while an actual temperature of the lower heat block is higher than an actual temperature of the upper heat block.

2. The method of manufacturing the solar cell module according to claim 1, wherein, in the step of detaching the first cushion sheet from the solar cell, the second cushion sheet is detached from the solar cell with the assistance of a conveyor belt.

3. The method of manufacturing the solar cell module according to claim 1, wherein the adhesive strength by which the second cushion sheet sticks to the solar cell is larger than the adhesive strength by which the first cushion sheet sticks to the solar cell.

4. The method of manufacturing the solar cell module according to claim 3, wherein the first cushion sheet is a fluorinated rubber sheet or a PET sheet, and the second cushion sheet is a silicone rubber sheet or an acrylic rubber sheet.

5. The method of manufacturing the solar cell module according to claim 1,
wherein the solar cell is conveyed by a conveyor belt to a position of the upper press member and the lower press member and
wherein the conveyor belt comprises a plurality of belts, with slits provided therebetween into which the second cushion sheet and the lower heat block can be inserted such that the first wiring member and the second wiring member are positioned face to face with the slits in plan view.

6. The method of manufacturing the solar cell module according to claim 1, further comprising forming the front-surface electrode and the back-surface electrode of the solar cell by screen printing.

7. The method of manufacturing the solar cell module according to claim 1, wherein the first and second cushion sheets are each made of a silicone rubber sheet.

* * * * *